(12) United States Patent
Vanderberg et al.

(10) Patent No.: US 7,435,971 B2
(45) Date of Patent: Oct. 14, 2008

(54) ION SOURCE

(75) Inventors: Bo H. Vanderberg, Gloucester, MA (US); Victor M. Beneviste, Gloucester, MA (US); John F. Fallon, Beverly, MA (US); Ilya Pokidov, Allston, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 207 days.

(21) Appl. No.: 11/437,547

(22) Filed: May 19, 2006

(65) Prior Publication Data

US 2008/0067412 A1 Mar. 20, 2008

(51) Int. Cl.
*H01J 37/08* (2006.01)
*H01J 7/24* (2006.01)
*H01J 27/20* (2006.01)

(52) U.S. Cl. .................. 250/423 R; 250/424; 250/427; 250/492.21; 315/111.81; 315/111.91

(58) Field of Classification Search ............. 250/423 R, 250/424, 427, 492.21; 315/111.81, 111.91
See application file for complete search history.

(56) References Cited

U.S. PATENT DOCUMENTS

| | | | |
|---|---|---|---|
| 5,262,652 A | 11/1993 | Bright et al. | |
| 5,497,006 A * | 3/1996 | Sferlazzo et al. | 250/427 |
| 5,517,077 A | 5/1996 | Bright et al. | |
| 5,554,852 A | 9/1996 | Bright et al. | |
| 5,763,890 A * | 6/1998 | Cloutier et al. | 250/427 |
| 5,857,889 A * | 1/1999 | Abbott | 445/49 |
| 5,886,355 A | 3/1999 | Bright et al. | |
| 6,136,725 A | 10/2000 | Loan et al. | |
| 6,452,338 B1 * | 9/2002 | Horsky | 315/111.81 |
| 6,975,072 B2 | 12/2005 | Leung et al. | |
| 2006/0097193 A1 | 5/2006 | Horsky et al. | |
| 2006/0272776 A1 | 12/2006 | Horsky et al. | |

FOREIGN PATENT DOCUMENTS

WO    WO 01/43157    6/2001

OTHER PUBLICATIONS

"Water Cooled Plasma Flood Source for Intense Ion Beam Implantation" to Zhimin Wan et al IEEE, 2002.

* cited by examiner

*Primary Examiner*—Nikita Wells
(74) *Attorney, Agent, or Firm*—Tarolli, Sundheim, Covell & Tummino LLP

(57) ABSTRACT

An exemplary ion source for creating a stream of ions has an aluminum alloy arc chamber body that at least partially bounds an ionization region of the arc chamber. The arc chamber body is used with a hot filament arc chamber housing that either directly or indirectly heats a cathode to sufficient temperature to cause electrons to stream through the ionization region of the arc chamber. A temperature sensor monitors temperatures within the arc chamber and provides a signal related to sensed temperature. A controller monitors sensed temperature as measured by the sensor and adjusts the temperature to maintain the sensed temperature within a range.

17 Claims, 6 Drawing Sheets

ION SOURCE

FIELD OF THE INVENTION

The present invention relates to an ion implanter having an ion generating source that emits ions to form an ion beam for beam treatment of a workpiece.

BACKGROUND ART

Ion implanters can be used to treat silicon wafers by bombardment of the wafers with an ion beam. One use of such beam treatment is to selectively dope the wafers with impurities of controlled concentration to yield a semiconductor material during fabrication of a integrated circuits.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes that energize and direct the flow of ions from the source. The desired ions are separated from byproducts of the ion source in a mass analysis device, typically a magnetic dipole performing mass dispersion of the extracted ion beam. The beam transport device, typically a vacuum system containing an optical train of focusing devices transports the ion beam to the wafer processing device while maintaining desired optical properties of the ion beam. Finally, semiconductor wafers are implanted in the wafer processing device.

Batch ion implanters include a spinning disk support for moving multiple silicon wafers through the ion beam. The ion beam impacts the wafer surface as the support rotates the wafers through the ion beam.

Serial implanters treat one wafer at a time. The wafers are supported in a cassette and are withdrawn one at time and placed on a support. The wafer is then oriented in an implantation orientation so that the ion beam strikes the single wafer. These serial implanters use beam shaping electronics to deflect the beam from its initial trajectory and often are used in conjunction with co-ordinated wafer support movements to selectively dope or treat the entire wafer surface.

Ion sources that generate the ion beams used in existing implanters are typically so called arc ion sources and can include heated filament cathodes for creating ions that are shaped into an appropriate ion beam for wafer treatment. U.S. Pat. No. 5,497,006 to Sferlazzo et al concerns an ion source having a cathode supported by a base and positioned with respect to a gas confinement chamber for ejecting ionizing electrons into the gas confinement chamber. The cathode of the '006 patent is a tubular conductive body and endcap that partially extends into the gas confinement chamber. A filament is supported within the tubular body and emits electrons that heat the endcap through electron bombardment, thermionically emitting the ionizing electrons into the gas confinement chamber.

U.S. Pat. No. 5,763,890 to Cloutier et al also discloses an arc ion source for use in an ion implanter. The ion source includes a gas confinement chamber having conductive chamber walls that bound a gass ionization zone. The gas confinement chamber includes an exit opening to allow ions to exit the chamber. A base positions the gas confinement chamber relative to structure for forming an ion beam from ions exiting the gas confinement chamber.

Other sources may drive RF, microwave or electron beam discharges to generate desired ions. These sources generate plasma densities 10-100 times lower than arc ion sources and are typically used with source materials that have low ionization potentials (species that are easy to ionize) or when the source chamber includes large ion extraction areas. While cold ion sources such as shown in U.S. Pat. No. 6,975,072 to Leung et al can have source materials made of relatively low temperature materials such as stainless steel, copper or aluminum, hot sources like arc ion sources expose the source chamber walls to an arc plasma of temperature of several tens of thousands of degrees Celsius and high thermal power densities which have required source components of prior art implanters to be made of high temperature, so called refractory, materials, such as molybdenum, tantalum or tungsten. See also the article "Water Cooled Plasma Flood Source for Intense Ion Beam Implantation" to Zhimin Wan et al IEEE, 2002 and US published application 2003:0218429.

SUMMARY OF THE INVENTION

The present disclosure concerns an arc ion source fabricated at least in part from aluminum. It has been discovered that by improved temperature control of the arc ion source of a "hot type" or arc based "Bernas" or Freeman-type" or ihc (indirectely heated cathode) ion source housing can be made using aluminum as a source arc chamber housing.

An exemplary ion source for creating a stream of ions has an aluminum alloy arc chamber body that at least partially bounds an ionization region containing gaseous ionization material that is ionized within an arc chamber region. In one exemplary embodiment, a temperature sensor monitors temperatures within the arc chamber and provides a signal related to sensed temperature. A controller monitors sensed temperature as measured by the sensor and adjusts the temperature to maintain the sensed temperature within a range.

Further features of the present invention will become apparent to those skilled in the art to which the present invention relates from reading the following specification with reference to the accompanying drawings.

EXEMPLARY EMBODIMENT FOR PRACTICING THE INVENTION

Figure 1:
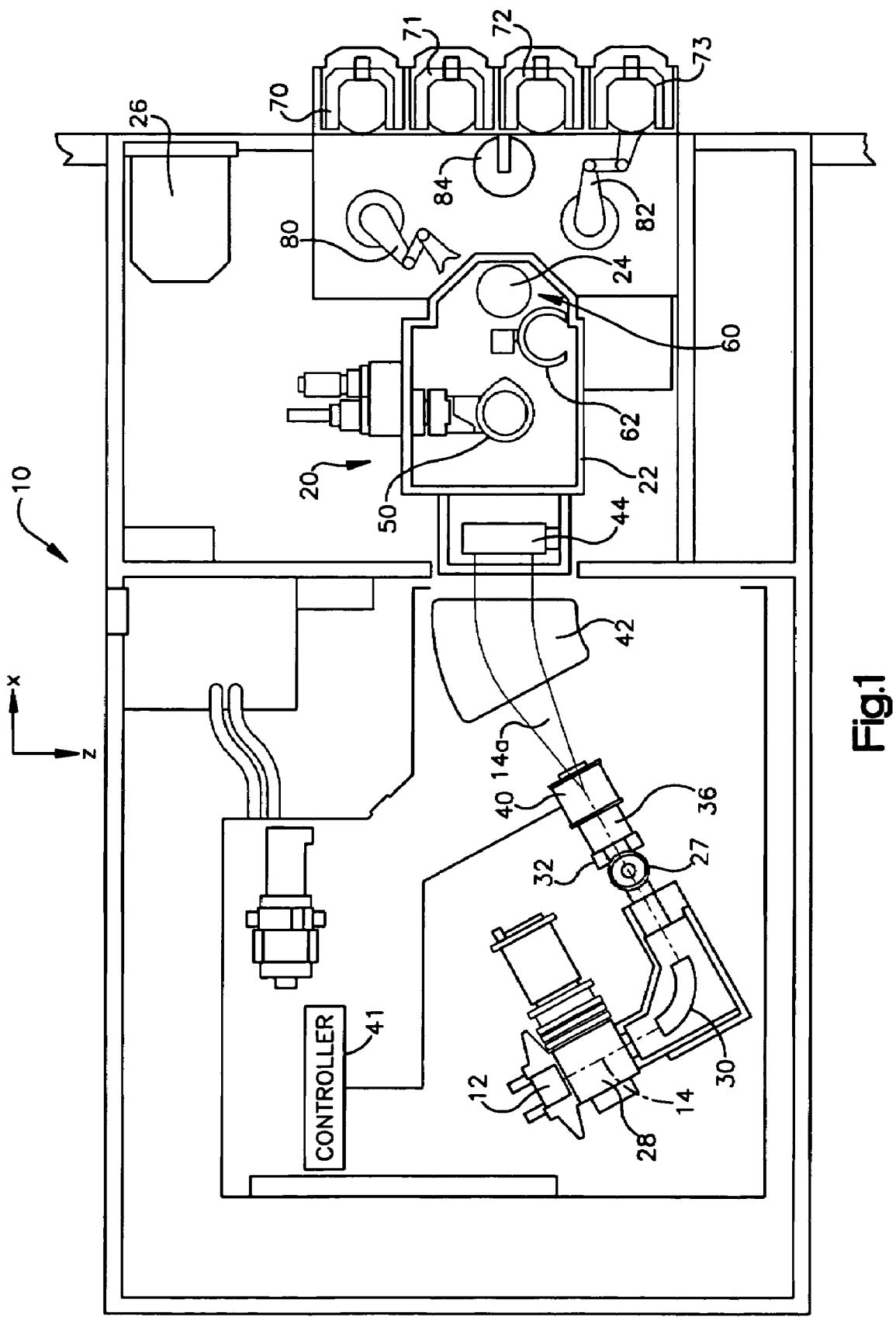
FIG. 1 is schematic view of an ion implanter for ion beam treatment of a workpiece such as a silicon wafer mounted on a spinning support.

Turning to the drawings, FIG. 1 illustrates a schematic depiction of an ion beam implanter 10. The implanter includes an ion source 12 for creating ions that form an ion beam 14 which is shaped and selectively deflected to traverse a beam path to an end or implantation station 20. The implantation station includes a vacuum or implantation chamber 22 defining an interior region in which a workpiece 24 such as a semiconductor wafer is positioned for implantation by ions that make up the ion beam 14. Control electronics indicated schematically as a controller 41 are provided for monitoring and controlling the ion dosage received by the workpiece 24.

Operator input to the control electronics are performed via a user control console 26 located near the end station 20. The ions in the ion beam 14 tend to diverge as the beam traverses a region between the source and the implantation chamber. To reduce this divergence, the region is maintained at low pressure by one or more vacuum pumps 27.

The ion source 12 includes a plasma chamber defining an interior region into which source materials are injected. The source materials may include an ionizable gas or vaporized source material. Ions generated within the plasma chamber are extracted from the chamber by ion beam extraction assembly 28 which includes a number of metallic electrodes for creating an ion accelerating electric field.

Positioned along the beam path 16 is an analyzing magnet 30 which bends the ion beam 14 and directs it through a beam shutter 32. Subsequent to the beam shutter 32, the beam 14 passes through a quadrupole lens system 36 that focuses the beam 14. The beam then passes through a deflection magnet 40 which is controlled by the controller 41. The controller 41 provides an alternating current signal to the conductive windings of the magnet 40 which in turn caused the ion beam 14 to repetitively deflect or scan from side to side at a frequency of several hundred Hertz. In one disclosed embodiment, scanning frequencies of from 200 to 300 Hertz are used. This deflection or side to side scanning generates a thin, fan shaped ribbon ion beam 14*a*.

Ions within the fan shaped ribbon beam follow diverging paths after they leave the magnet 40. The ions enter a parallelizing magnet 42 wherein the ions that make up the beam 14*a* are again bent by varying amounts so that they exit the parallelizing magnet 42 moving along generally parallel beam paths. The ions then enter an energy filter 44 that deflects the ions downward (y-direction in FIG. 1) due to their charge. This removes neutral particles that have entered the beam during the upstream beam shaping that takes place.

The ribbon ion beam 14*a* that exits the parallelizing magnet 42 is an ion beam with a cross-section essentially forming a very narrow rectangle that is, a beam that extends in one direction, e.g., has a vertical extent that is limited (e.g. approx ½ inch) and has an extent in the orthogonal direction that widens outwardly due to the scanning or deflecting caused to the magnet 40 to completely cover a diameter of a workpiece such as a silicon wafer.

Generally, the extent of the ribbon ion beam 14*a* is sufficient to, when scanned, implant an entire surface of the workpiece 24. Assume the workpiece 24 has a horizontal dimension of 300 mm. (or a diameter of 300 mm.). The magnet 40 will deflect the beam such that a horizontal extent of the ribbon ion beam 14*a*, upon striking the implantation surface of the workpiece 24 within the implantation chamber 22, will be at least 300 mm.

A workpiece support structure 50 both supports and moves the workpiece 24 (up and down in the y direction) with respect to the ribbon ion beam 14 during implantation such that an entire implantation surface of the workpiece 24 is uniformly implanted with ions. Since the implantation chamber interior region is evacuated, workpieces must enter and exit the chamber through a loadlock 60. A robotic arm 62 mounted within the implantation chamber 22 automatically moves wafer workpieces to and from the loadlock 60. A workpiece 24 is shown in a horizontal position within the load lock 60 in FIG. 1. The arm moves the workpiece 24 from the load lock 60 to the support 50 by rotating the workpiece through an arcuate path. Prior to implantation, the workpiece support structure 50 rotates the workpiece 24 to a vertical or near vertical position for implantation. If the workpiece 24 is vertical, that is, normal with respect to the ion beam 14, the implantation angle or angle of incidence between the ion beam and the normal to the workpiece surface is 0 degrees.

In a typical implantation operation, undoped workpieces (typically semiconductor wafers) are retrieved from one of a number of cassettes 70-73 by one of two robots 80, 82 which move a workpiece 24 to an orienter 84, where the workpiece 24 is rotated to a particular orientation. A robot arm retrieves the oriented workpiece 24 and moves it into the load lock 60. The load lock closes and is pumped down to a desired vacuum, and then opens into the implantation chamber 22. The robotic arm 62 grasps the workpiece 24, brings it within the implantation chamber 22 and places it on an electrostatic clamp or chuck of the workpiece support structure 50. The electrostatic clamp is energized to hold the workpiece 24 in place during implantation. Suitable electrostatic clamps are disclosed in U.S. Pat. Nos. 5,436,790, issued to Blake et al. on Jul. 25, 1995 and 5,444,597, issued to Blake et al. on Aug. 22, 1995, both of which are assigned to the assignee of the present invention. Both the '790 and '597 patents are incorporated herein in their respective entireties by reference.

After ion beam processing of the workpiece 24, the workpiece support structure 50 returns the workpiece 24 to a horizontal position and the electrostatic clamp is de-energized to release the workpiece. The arm 62 grasps the workpiece 24 after such ion beam treatment and moves it from the support 50 back into the load lock 60. In accordance with an alternate design the load lock has a top and a bottom region that are independently evacuated and pressurized and in this alternate embodiment a second robotic arm (not shown) at the implantation station 20 grasps the implanted workpiece 24 and moves it from the implantation chamber 22 back to the load lock 60. From the load lock 60, a robotic arm of one of the robots moves the implanted workpiece 24 back to one of the cassettes 70-73 and most typically to the cassette from which it was initially withdrawn.

Ion Source

The ion generating source 12 (FIGS. 2-5) embodying the present invention includes a source block 120 supported by the flange 82 having handles 83 by which the source 12 can be removed from the implanter. The source block 120 supports a plasma arc chamber 76 and an electron emitting cathode 124 that in the preferred embodiment of the invention is supported by but electrically isolated from the arc chamber 76.

An arc ion source is defined in the textbook "Plasma Physics in Theory and Application" Ed. W. Kunkel, MacGraw-Hill, 1966 by noting that ""All [electrical] discharges with eVc<E [Vc is cathode voltage drop, E is ionization energy] will be classified as electric arcs regardless of specific conditions at the cathode or in the body of the plasma. [ . . . ] Obviously, in this way the category of arcs is very large, since no restrictions are placed on either gas pressure or current density. In fact, all thermionic diodes must be included here as long as sufficient gas ionization occurs to produce a substantial neutralization of the space charge, so that the term discharge plasma may still be appropriate. Depending on gas density, current density, and the conditions at the cathode, arc discharges can differ greatly in their characteristic properties."This definition is summarized herein by referring to a "hot filament" ion source as one where either electrons of a sufficient energy are emitted from a directly energized filament (which thus acts as a cathode) or wherein electrons from an energized filament bombard a cathode which turn emits electrons of sufficient energy to ionize a gas within an arc chamber.

A source magnet (Not Shown) encircles the plasma arc chamber 76 to confine the plasma generating electrons to tightly constrained travel paths within the chamber 76. The source block 120 also defines cavities that accommodate vaporizer ovens 122, 123 that are filled with vaporizable solids such as arsenic that are vaporized to a gas and then injected into the plasma chamber 76 by means of delivery nozzles 126, 128 which pass through a heat shield 130. The plasma arc chamber 76 is an elongated metal structure made of an aluminum alloy. One suitable alloy is 6061 Aluminum which is readily available commercially with advantageous machining properties. This alloy contains 96-98% aluminum with the addition of 0.8-2% magnesium and 0.4-0.8 silicon with the addition of trace amounts of other constituents (source: matweb.com). The housing defines an interior ionization region R bounded by two elongated side walls, top and bottom walls. A separate front wall defining plate 132 constructed from tungsten or molybdenum abuts the ionization region R. Extending outwardly from its two side walls the arc chamber includes a support flange 134 for mounting the arc chamber to the source block.

Four elongated posts 136 pass through four notches 138 in the plate 132. The posts 136 pass through bushings 146 supported by the source block and springs 148 that bias the plate 132 toward the arc chamber 76.

Gaseous material can be injected into the interior of the plasma arc chamber 76 from the vaporizers 122,123 by the delivery nozzles 126, 128 which extend through openings 131, 133 in the source block 120. On opposite sides of the chamber 76 passageways 141 extend from a rear of the chamber 76 through a chamber body and open into the interior of the plasma arc chamber 76. The nozzles abut entryways to these passages to deliver gaseous source material from the ovens 122, 123. Additionally, gas can be directly routed into the chamber 76 by means of a port or opening 142 in a rear wall of the chamber. A delivery tube 144 leading to the opening 142 injects gas directly into the arc chamber 76 from a source or supply external to the ion source.

An end wall of the arc chamber defines an opening 158 sized to allow the cathode 124 to extend into an interior of the plasma arc chamber 76 without touching the chamber wall that defines the opening 158. The cathode 124 is supported by an insulating mounting block 150 coupled to the rear of the arc chamber. A cathode body that fits into the opening 158 is mounted to a conductive mounting plate 152 supported by the insulating mounting block 150.

The cathode 124 is constructed substantially in accordance with the disclosure of the Cloutier et al '890 patent. An outer tubular member of the cathode 124 is made from a refractory material. A lower end of this tubular member abuts the mounting plate 152. An inner tubular member is also made from a refractory material and has a threaded lower end portion that is threaded into a threaded opening in the mounting plate 152. An end cap 164 of the cathode 124 is conductive and is made from a refractory material and fits within a counterbore of an end of the tubular members. The length of the inner and outer tubular members so that the end cap 164 extends upward into the arc chamber 76 beyond the end of the outer tubular member.

Two conductive mounting arms 170, 171 support a filament 178 inside the cathode 124. The arms 170, 171 are attached directly to the insulating block 150 by connectors 172 that pass through the arms to engage threaded openings in the block 150. Conductive energizing bands 174 are coupled to the filament and energized by signals routed through the flange 82 of the housing 80 via power feedthroughs 175, 176. The filament 178 is made of a tungsten wire bent to form a helical loop. Ends of the filament 178 are supported by two refractory material legs held in electrical contact with the two arms 170, 171 by suitable clamps.

When the tungsten wire filament 178 is energized by application of a potential difference across the power feedthroughs 175, 176 the filaments emit electrons which accelerate toward and impact the end cap of the cathode 124. When the cap is sufficiently heated by electron bombardment, it in turn emits electrons into the arc chamber 76 which strike gas molecules and create ions within the chamber 76. An ion plasma is created and ions within this plasma exit the opening 78 in the plate 132 to form the ion beam. The cap shields the filament from contact with the ion plasma within the chamber and extends the life of the filament.

Electrons generated by the cathode 124 that are emitted into the arc chamber 76 but which do not engage a gas molecule within a gas ionization zone move to the vicinity of a repeller 180. The repeller 180 includes a metal member located within the arc chamber 76 which deflects electrons back into the gas ionization zone where it will probably impact a gas molecule. The metal member of the repeller is made of refractory material. A ceramic insulator insulates the repeller 180 from the electrical potential of a lower wall of the plasma arc chamber 76. The cathode 124 and repeller 180 are therefore electrically and thermally isolated from the arc chamber walls.

Figure 2:
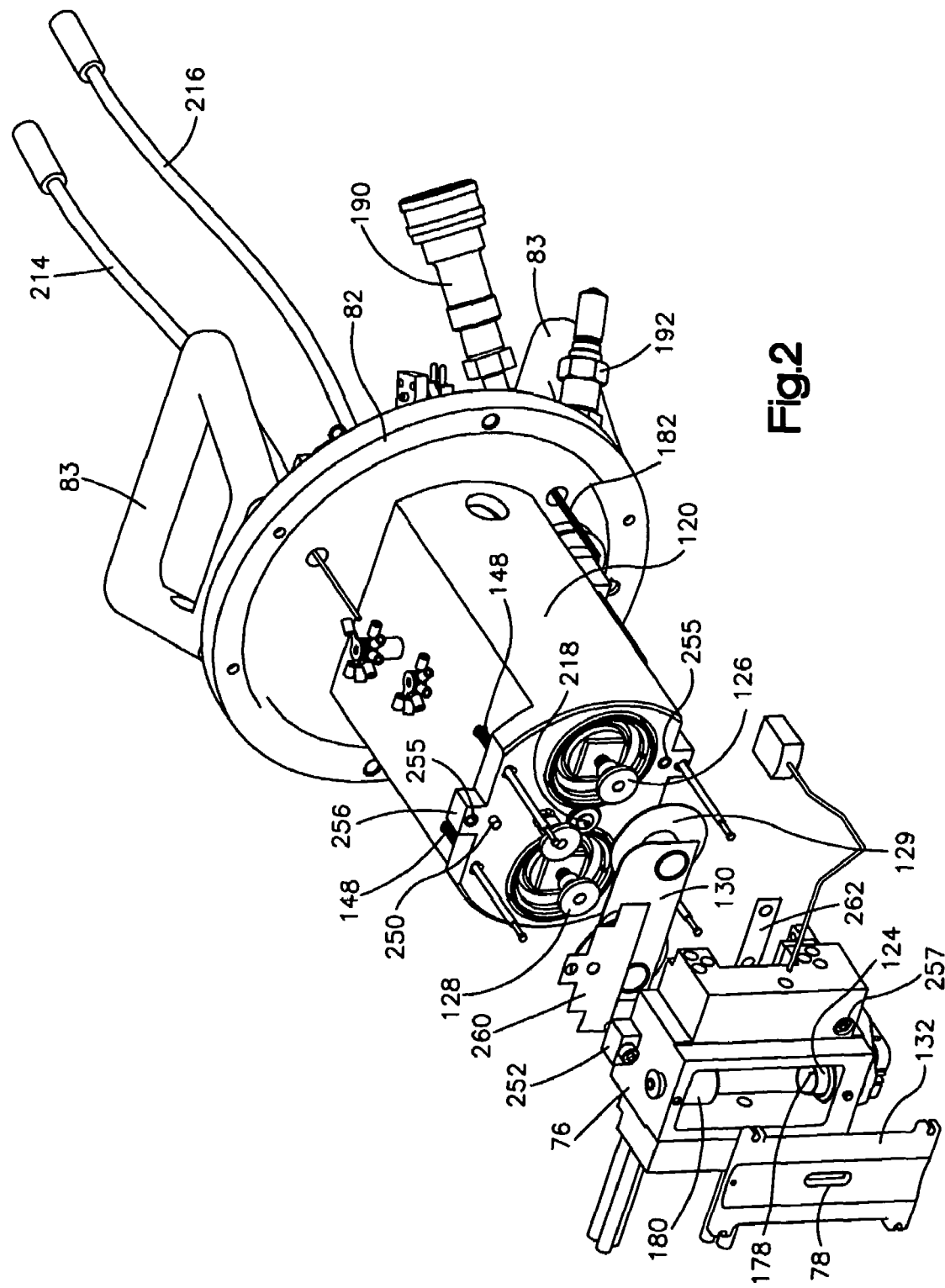
FIGS. 2 and 3 are exploded perspective views of an ion source constructed in accordance with the invention.
Figure 3:
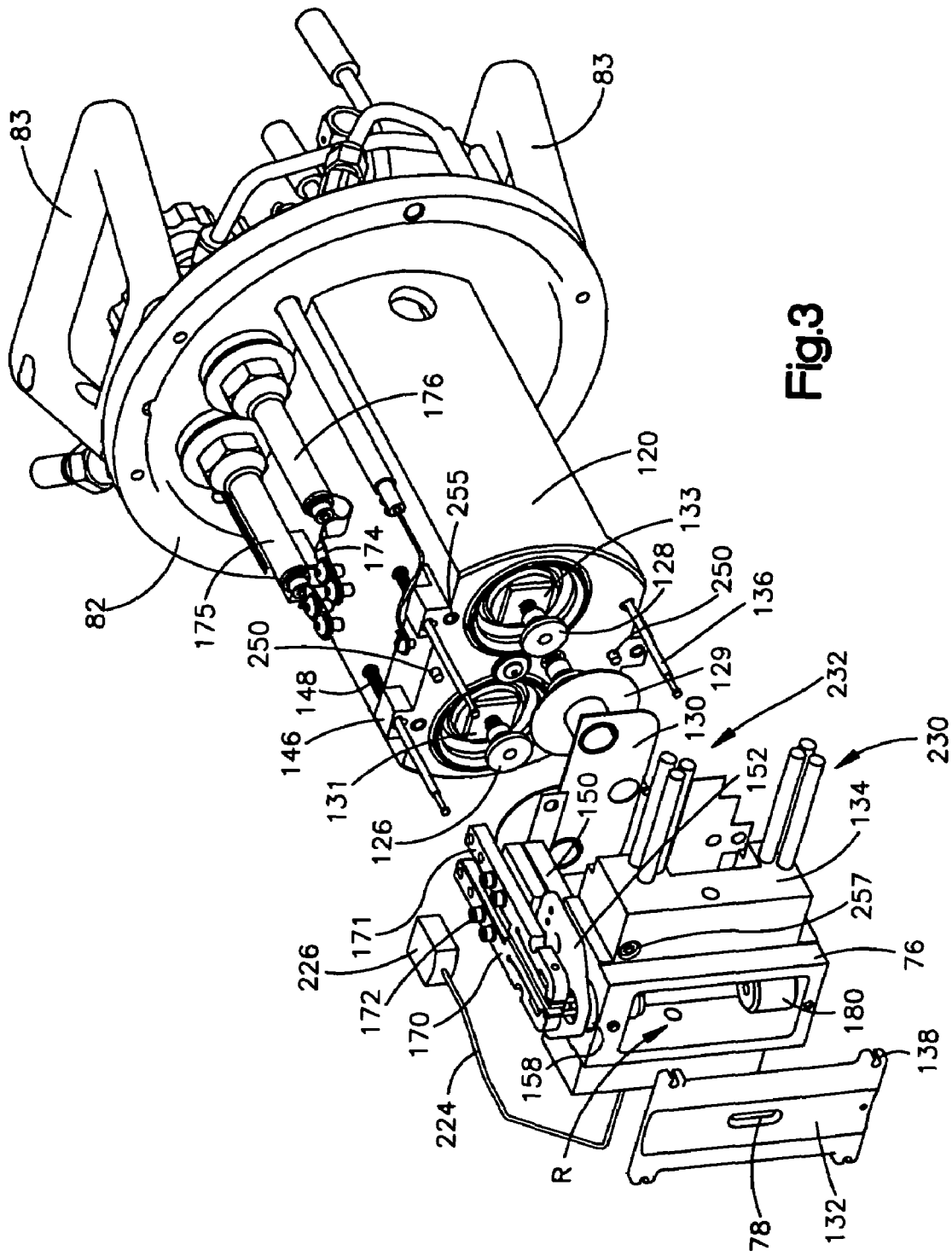
Figure 4:
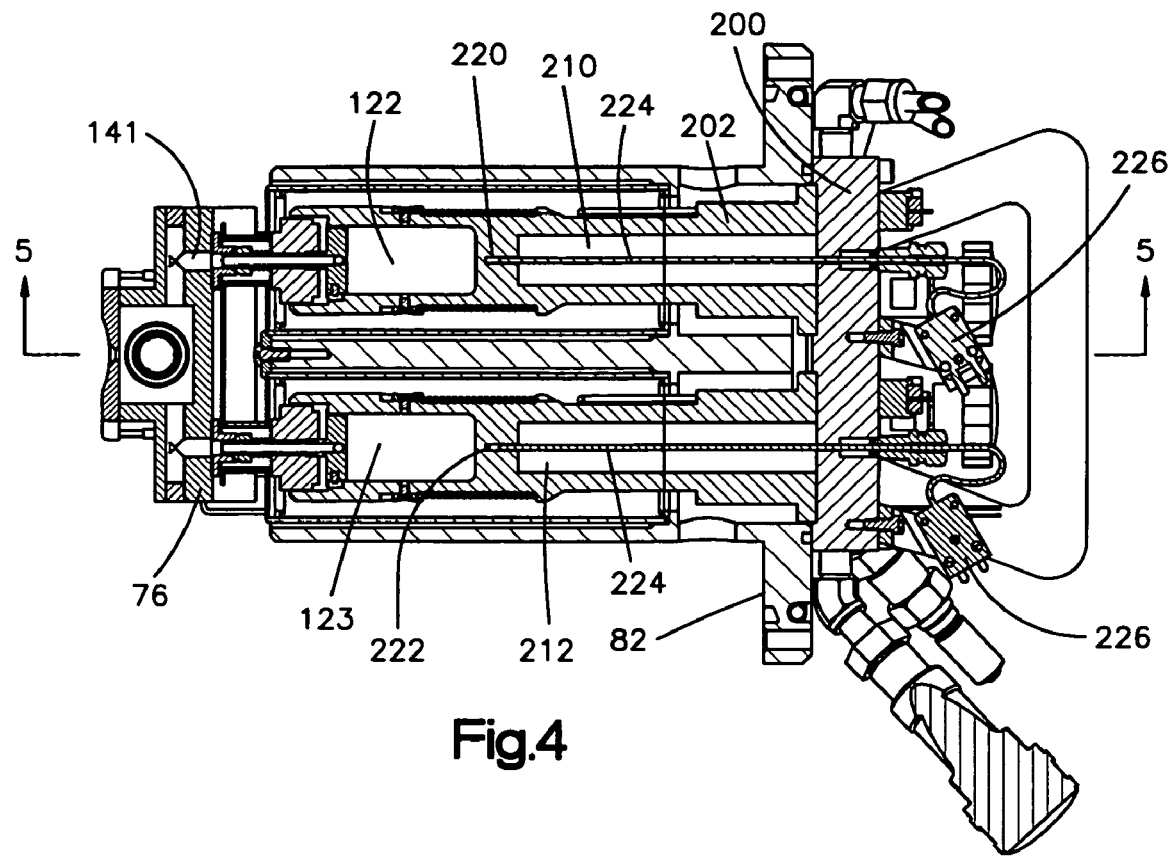
FIG. 4 is a sectional view of the ion source of FIGS. 2 and 3.
Figure 5:
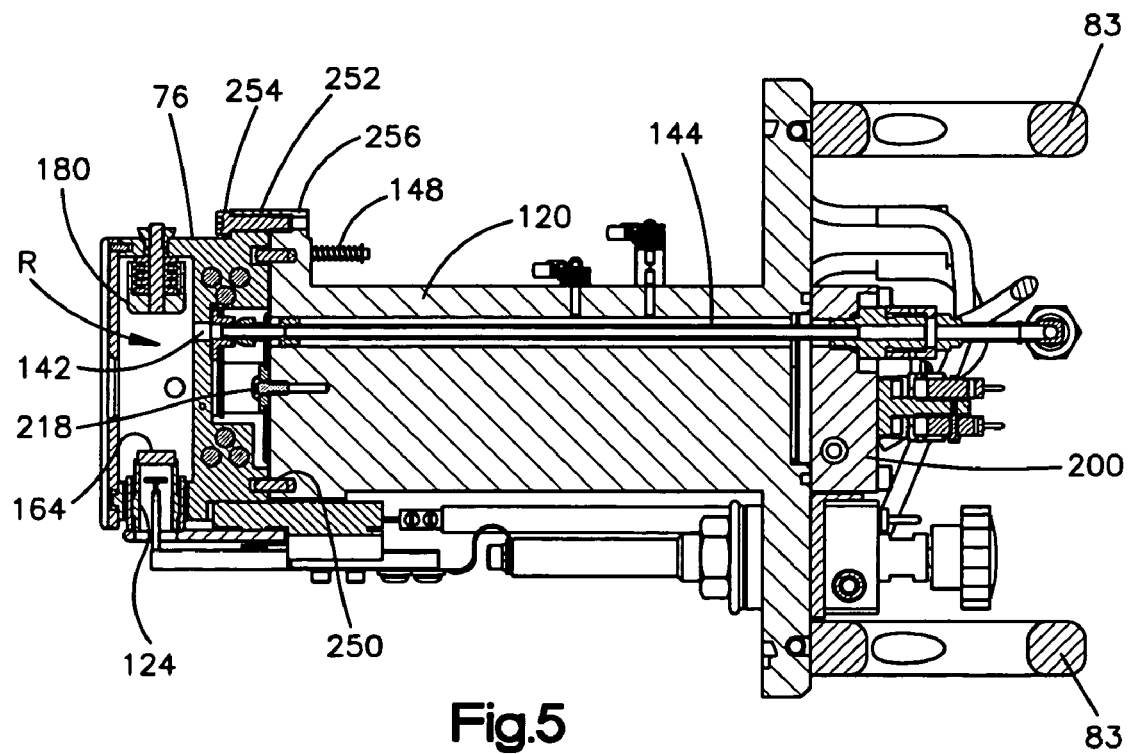
FIG. 5 is a view from the plane defined by the line 5-5 in FIG. 4.

The walls of the chamber 76 are held at a local ground or reference electric potential. The cathode, including the cathode end cap 164 is held at a potential of between 50-150 volts below the local ground of the chamber walls. This electric potential is coupled to the plate 152 by a power feedthrough for attaching an electrical conductor to the plate 152 that supports the cathode. The feedthrough 182 is shown in FIG. 2 and FIG. 3. The connection from the feedthru to the cathode block is not shown in the drawings. The filament 178 is held at a voltage of between 200 and 600 volts below that of the end cap 164. The large voltage difference between the filament and the cathode imparts a high energy to the electrons leaving the filament that is sufficient to heat the end cap 164 and thermionically emit electrons into the chamber 76. The repeller member 180 is allowed to float at the electrical potential of the gas plasma within the chamber 76.

The '006 patent to Sferlazzo et al depicts a schematic of a circuit that controls arc current between the cathode and the anode (chamber walls of the arc chamber). The operation of this circuit is described in the Sferlazzo et al patent and is also incorporated herein. During generation of ions, the source heats up due to the injection of ionizing energy into the arc chamber. Not all of this energy ionizes the gas within the arc chamber and a certain amount of heat is generated. The chamber includes water couplings 190, 192 that route cooling water into the flange and route heated water away from the region of the arc chamber.

In addition to mounting the cathode 124 to the arc chamber the insulating block 150 positions the filament 178 with respect to the cathode body and the cathode body with respect to the arc chamber. These functions are described in greater detail in the Cloutier et al patent Certain design goals are achieved through practice of the invention and more particularly through use of the exemplary source 12. It is one goal of the invention that the temperature of the arc chamber 76 be maintained between 400 degrees C. and 550 degrees C. for application of minimum (e.g. 400 W) to maximum (e.g. 1500 Watts) of power. At temperatures below 400 C there is a risk that source materials containing arsenic, such as $AsH_3$, a commonly used source gas, condense inside the ion source which would affect source operation and contaminate the source if other source gases are subsequently used. At temperatures over 550 C it has been established that aluminum alloys lose their mechanical properties in terms of hardness and elasticity, which affects the mechanical integrity of the source assembly and extraction properties. Over this range of temperatures, the source must provide good alignment of the arc slit 78 relative to the source block 120. The exemplary design must allow for thermal expansion of the assembled components, especially the arc chamber 76 and the arc slit 78. Representative tolerances are on the order of 0.1 mm for the gap width, 0.03 mm for side to side positioning of the arc chamber and 0.1 degree for tilt of the arc chamber exit aperture about a vertical axis. These design guidelines are especially important in medium current implanters where accurate placement of the ion beam on the wafer is more important.

Maintaining the arc chamber in the above specified or desired temperature range allows the source housing to be made of aluminum which is cheaper to fabricate and lighter weight than the prior art arc chamber material. (such as molybdenum) The source block 120 (to which the arc chamber is attached) is also fabricated from aluminum.

A vaporizer assembly 202 is made of stainless steel and is brazed onto a steel plate 200. The vaporizer assembly defines spaced interior cavities 210, 212 into which nitrogen is pumped via flexible conduits 214, 216. The nitrogen is routed into the cavities to achieve an additional degree of temperature control over the desired range of arc source housing temperatures. Although in the preferred embodiment, nitrogen is used, normal atmospheric air could also be routed into and out of the cavities. A connector 218 threads into the source block 120 in a region of the passageways 131, 133 and holds radiation shields (one for each vaporizer) in place within those passageways 131, 133.

Figure 6:
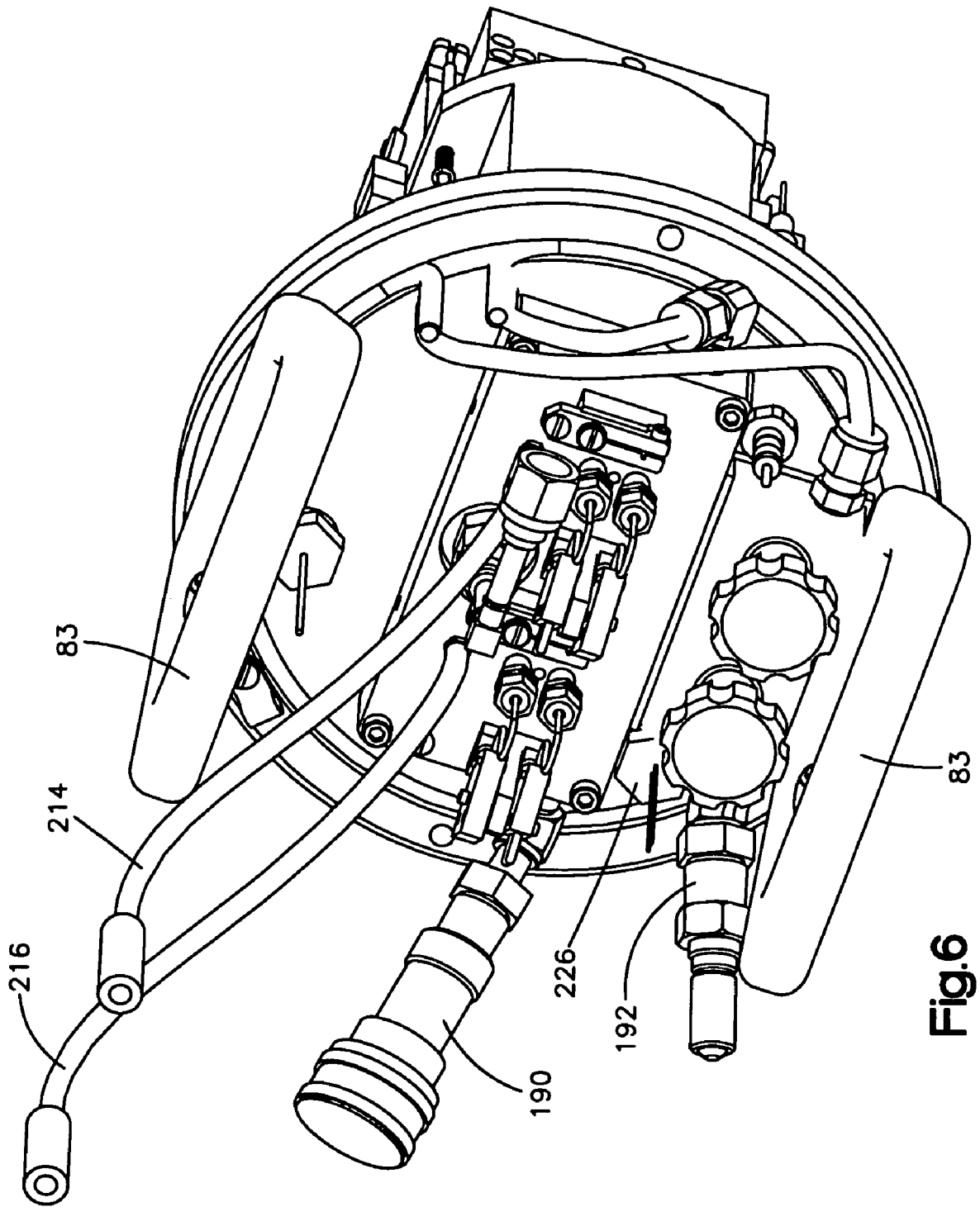
FIG. 6 is a rear perspective view of the ion source.

The temperature in the region of the vaporizer oven is monitored by sensors 220, 222 positioned within the source block include temperature responsive thermocouples which route signals via conductors 224 to connectors 226 which route output signals to a separate vaporizer controller (not shown). A third sensor (not shown) is positioned within the arc source housing and is coupled to a conductor 224 which routes signals away from the arc source housing to an additional or third connector 226 mounted to the flange shown in FIG. 6, which in turn routes a signal to the controller 300.

The exemplary source also includes two sets 230, 232 of three elongated, generally cylindrical heaters that are inserted into generally parallel extending passageways in the arc source housing. These heaters are individually activated resistance heaters available as Dalton Watt flex cartridge heaters that include a flexible stainless steel outer jacket. The outer surface provides radiative heat to the arc chamber. The resistance heaters inside the jacket heat the jacket. The flexible outer jacket is compressed inwardly as they are pushed into its corresponding passageway. As the arc chamber housing expands and contracts with temperature variations, the outer jacket of these heater cartridges expands and contracts to maintain good thermal conductivity between the internally embedded resistance heaters and the aluminum arc chamber housing that defines the elongated cavities. These heaters are powered by a d.c. power supply and can be activated with up to 240 volts DC/AC.

Accuracy in mounting is achieved by the use of two mounting pins 250 and connectors 254. At one end of the arc chamber housing, the housing includes a boss 252 having a throughpassage. The throughpassage accommodates one of three threaded connectors 254 which engages a threaded opening 255 in an aligned boss 256 mounted onto the source block 120. The other connectors (not shown) extend through openings 257 in the arc chamber housing 76 and thread into two other threaded openings 255 spaced about an end surface of the source block facing the arc source housing.

During assembly of the source 12, the arc chamber is brought into engagement with the source block. This step is facilitated by the pins 250 which extend from the exposed end of the source block. The threaded connectors pass through the arc chamber screwed into the source block and tightened. The pins firmly position the arc chamber and arc slit with respect to the source block. Temperature variations cause both chamber and source block to expand and contract around a vertical centerline bisecting the two mounting pins 250. Unequal rates of expansion between the arc chamber and source block can occur due to the flexibility of the threaded connectors 254 which have a degree of play to allow slight relative sideways movements of the arc chamber with respect to the source block.

Heat conduction between the source block and the arc chamber is also promoted by use of two eGraf™ gaskets 260, 262 mounted between the arc chamber and the source block. The gaskets 260, 262 define holes at appropriate locations to accommodate the threaded connectors 254. These gaskets are constructed from graphite and are constructed from low thermal resistance material and is specifically made for thermal contact interfacing. These gaskets promote heat conduction at high operating temperatures (at the high end of the desired temperature range) and as such impede high temperature swings by promoting heat flow away from the arc chamber when operating at the high temperature range. In the exemplary embodiment the gasket is fabricated to have a controlled thickness of 5/1000 inch. The eGraf gasket has a specified operating temperature of up to 400 degrees Celsius but in practice operates at higher temperatures up to the 550 degrees C. upper limit of source operation.

Figure 7:
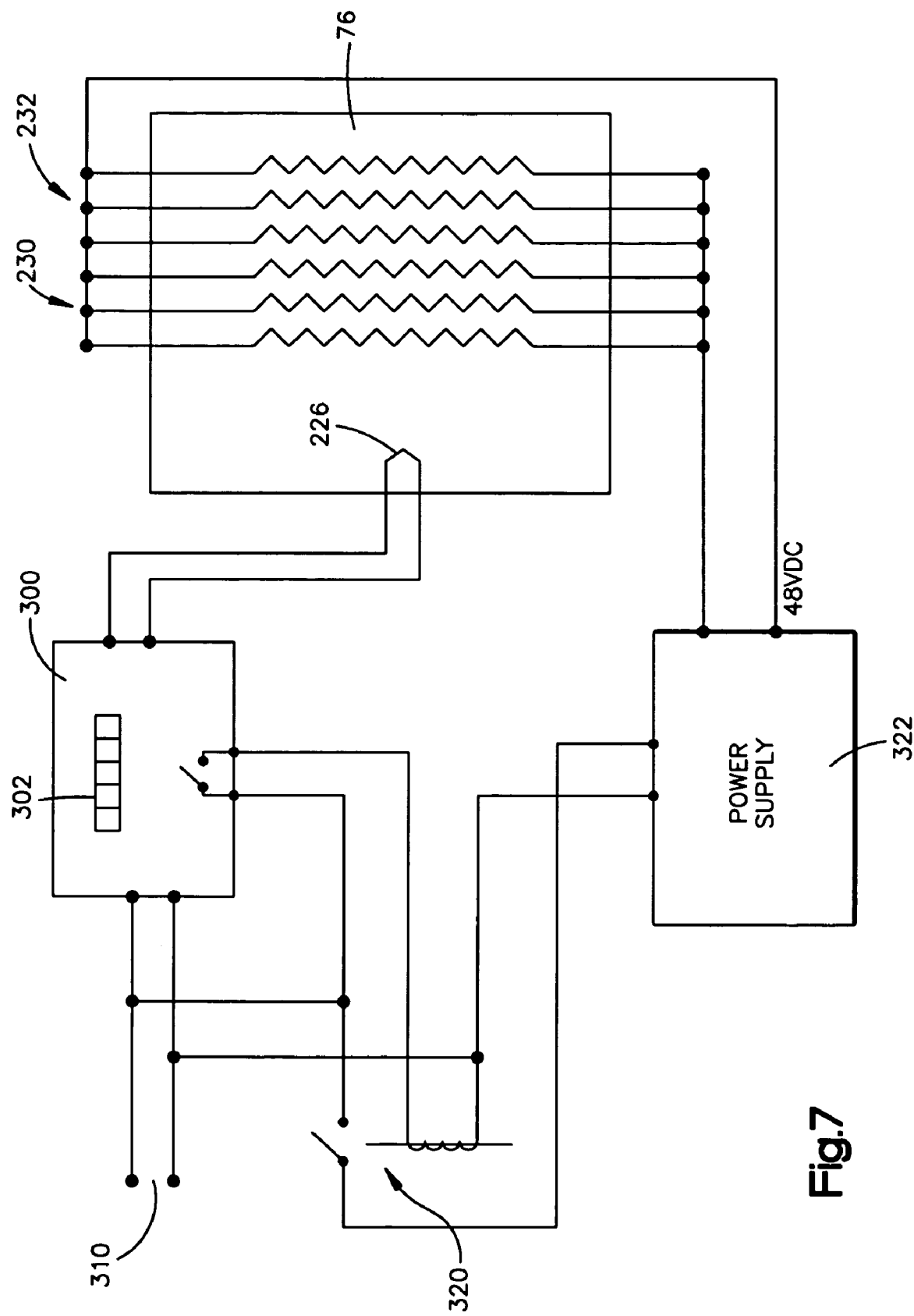
FIG. 7 is a schematic control circuit for operating an ion source constructed in accordance with the invention.

FIG. 7 is a control schematic or flow chart documenting how to maintain within the target temperature range. A temperature controller 300 (with controller input 302 to adjust the temperature) has an alternating current input 310 and a input for sensing a temperature from a thermocouple 226 that monitors the arc chamber temperature. The controller 300 opens and closes a contact of a relay 320 to cause DC power from a supply to be applied across the two sets of heater elements in parallel. The controller 300 implements a constant power control, where the total power input to the arc source cathode and the heaters that make up the two sets 230, 232 is maintained. If the arc source is operated at high power, (high beam currents) then the heaters run at low power. Conversely, if the arc source is operated at low power (low beam current) then the heater is run at a high power. The vaporizer ovens are decoupled from this control since the control must work in applications where gaseous material is pumped directly to the arc chamber.

To implement this control, the controller 300 makes use of sensed temperature and a control loop where the power to the heaters is varied based on temperature. As the temperature of the arc chamber approaches the upper range the power to the heaters is reduced and conversely as the temperature approaches the lower range the power to the heats is increased.

Even if there is no active control of the temperature of the arc chamber, the power range within which the implanter operates can be limited. If the temperature of the arc chamber is maintained within 400 C and 550 C, that defines a minimum and maximum source power, the value of which depends on the design of the thermal circuit. There may be applications where the source runs within a limited range of or at almost constant power, such as a dedicated implanter— for these applications, no active control is needed. Active control lets the exemplary system run within a much wider power range—the range is expanded by the power the control system can provide.

From the above description of a preferred embodiment of the invention, those skilled in the art will perceive improvements, changes and modifications. Such improvements, changes and modifications within the skill of the art are intended to be covered by the appended claims.

The invention claimed is:

1. A hot filament-type ion source for use in creating a stream of ions comprising:
   an arc chamber housing defining an ionization region, said arc chamber being comprised of an aluminum-alloy material;
   a hot filament electron emitting cathode coupled to said arc chamber for emitting electrons into the ionization region thereof;
   a gas delivery system for injecting gas molecules into the ionization region of said arc chamber; and
   a control circuit for maintaining an operating temperature of the arc chamber housing to a temperature range within a range of 400 C.-550 C.;
   wherein, high energy electrons of sufficient energy to ionize the gas molecules injected into said arc chamber are emitted from the cathode into the housing interior to ionize gas molecules injected into the housing interior.

2. The ion source of claim 1 wherein the control circuit comprises a temperature sensor for monitoring temperature of the arc chamber housing.

3. The ion source of claim 1 additionally comprising:
   a) a temperature sensor for monitoring temperatures of the arc chamber housing and providing a signal related to sensed temperature; and
   b) wherein the control circuit monitors sensed temperature as measured by the sensor and adjusting the temperature to maintain the sensed temperature within a desired temperature range.

4. The ion source of claim 3 wherein the arc chamber housing includes passageways that support resistive heating elements coupled to the control circuit for raising and lowering the temperature of the arc chamber housing.

5. The ion source of claim 4 wherein the resistive heating elements include outer flexible jackets that expand and contract with temperature changes to maintain good heat transfer between the housing and the resistive heating elements.

6. The ion source of claim 1 further comprising a source block supporting the arc chamber body that includes an oven for injecting gaseous ionization material into the arc chamber housing interior and wherein the arc chamber housing is spaced from the source block by a temperature insulating heat shield interposed between the arc chamber housing and the source block.

7. The ion source of claim 1 additionally comprising an oven supported in an aluminum alloy source block for injecting gaseous ionization material into the arc chamber.

8. The ion source of claim 7 wherein the oven includes cavities for receipt of cooling gas for cooling the oven.

9. The ion source of claim 7 wherein the source block has locating pins which engage corresponding holes in the arc chamber housing at spaced positions along a centerline while allowing expansion and contraction of the arc chamber body on either side of the centerline.

10. The ion source of claim 9 further comprising an exit aperture plate having an arc slit aligned generally of the center line about which expansion and contraction of the arc chamber body occurs.

11. The ion source of claim 1 further comprising an exit aperture plate which is mounted to mounting posts and comprising springs for biasing the aperture plate against the arc chamber housing.

12. A method for generating an ion beam comprising:
   a) positioning an aluminum alloy arc chamber housing that at least partially bounds an ionization region to emit a stream of ions by mounting the arc chamber housing to a source block for positioning the arc chamber housing with respect to an ion path of travel;
   b) directing electrons through the ionization region by emitting said electrons from a hot filament electron emitting cathode;
   c) accelerating electrons emitted from said cathode through the ionization region to form ions;
   d) controlling power applied to the arc chamber to maintain the sensed temperature within a temperature range of 400 C-550 C; and
   e) emitting ions from the arc chamber housing to form the beam.

13. The method of claim 12 additionally comprising monitoring temperatures at a region of the arc chamber housing and providing a signal related to sensed temperature for use in determining how much power to apply to the arc chamber.

14. The method of claim 12 wherein the positioning comprises fixing a source block with respect to an ion beam travel path and connecting the arc chamber body to the source body along a center line to allow for expansion and contraction of the arc chamber body with temperature changes.

15. The method of claim 14 wherein the source block is spaced from the arc chamber body by a thermally conductive gasket which inhibits temperature variations at a high end of the desired temperature range.

16. The method of claim 12 wherein a temperature of the arc chamber housing is controlled by placing a resistive heater in contact with an arc chamber body and adjusting current through the resistive heater.

17. The method of claim 16 wherein thermal conduction between the resistive heater and housing body is maintained by a flexible jacket that surrounds the resistive heater.

* * * * *